(12) United States Patent
Jurczak et al.

(10) Patent No.: US 6,607,968 B1
(45) Date of Patent: Aug. 19, 2003

(54) METHOD FOR MAKING A SILICON SUBSTRATE COMPRISING A BURIED THIN SILICON OXIDE FILM

(75) Inventors: Malgorzata Jurczak, Grenoble (FR); Thomas Skotnicki, Crolles Montfort (FR)

(73) Assignee: France Telecom, Paris (FR)

( * ) Notice: Subject to any disclaimer, the term of this patent is extended or adjusted under 35 U.S.C. 154(b) by 0 days.

(21) Appl. No.: 10/018,680

(22) PCT Filed: Jun. 8, 2000

(86) PCT No.: PCT/FR00/01570

§ 371 (c)(1),
(2), (4) Date: Apr. 22, 2002

(87) PCT Pub. No.: WO00/77846

PCT Pub. Date: Dec. 21, 2000

(30) Foreign Application Priority Data

Jun. 14, 1999 (FR) .............................. 99 07496

(51) Int. Cl.⁷ .............................................. H01L 21/30
(52) U.S. Cl. ..................... 438/455; 438/457; 438/458; 438/464
(58) Field of Search ................. 438/455, 457, 438/459, 409, 458, 406, 753, 309, 311, 464, 465; 257/55, 56

(56) References Cited

U.S. PATENT DOCUMENTS 5,218,213 A * 6/1993 Gaul et al. ................. 257/55
5,476,813 A * 12/1995 Naruse ..................... 437/132
5,906,708 A * 5/1999 Robinson et al. ........ 156/657.1
6,100,166 A * 8/2000 Sakaguchi et al. .......... 438/455
6,143,628 A * 11/2000 Sato et al. .................. 438/455
6,294,478 B1 * 9/2001 Sakaguchi et al. .......... 438/753
6,534,382 B1 * 3/2003 Sakaguchi et al. .......... 438/455

FOREIGN PATENT DOCUMENTS

| EP | 0 371 862 | 6/1990 |
|---|---|---|
| EP | 0 779 649 | 6/1997 |
| WO | 96/15550 | 5/1996 |

* cited by examiner

Primary Examiner—Richard Booth
Assistant Examiner—Renzo N. Rocchegiani
(74) Attorney, Agent, or Firm—Meyertons, Hood, Kivlin, Kowert & Goetzel, P.C.; Eric B. Meyertons

(57) ABSTRACT

A method for making a silicon substrate having a buried thin silicon oxide film is described. The method consists of: a) producing a first element having a first silicon body whereof the main surface is coated, in succession, with a buffer layer of germanium, or of an alloy of germanium and silicon, and with a thin silicon film; b) producing a second element, having a silicon body whereof a main surface is coated with a thin silicon oxide film; c) linking the first element with the second element such that the thin silicon film of the first element is in contact with the thin silicon oxide film of the second element; and d) eliminating the buffer layer to recuperate the silicon substrate having a buried thin silicon oxide film and a reusable silicon substrate. The method may be useful in making microelectronic devices such as CMOS and MOSFET devices.

30 Claims, 2 Drawing Sheets

METHOD FOR MAKING A SILICON SUBSTRATE COMPRISING A BURIED THIN SILICON OXIDE FILM

BACKGROUND OF THE INVENTION

1. Field of the Invention

The present invention generally relates to a method of fabricating a silicon substrate having a thin buried silicon oxide layer (SOI substrate) and in particular to a method of this sort which makes it possible to produce an SOI substrate having a buried silicon oxide layer that is extremely thin and has excellent uniformity.

2. Description of the Related Art

The known techniques of fabricating an SOI substrate all have a number of drawbacks, in particular, a low production yield, a substrate quality which is still inadequate, and the production of a thin Si layer and a thin buried silicon oxide layer which are relatively thick and of mediocre uniformity.

A first method of fabricating an SOI substrate, known by the name of "SIMOX technology", consists of forming the buried $SiO_2$ layer in a silicon substrate by implanting oxygen at high dose followed by annealing at a temperature greater than 1300° C. A major drawback of this method is that it requires nonstandard equipment. Furthermore, the length of time for the process of implanting oxygen at high dose considerably reduces the production efficiency.

The substrates obtained by this method also suffer from inadequate quality of the buried silicon oxide layer and of the thin silicon layer (high pinhole density).

Finally, because the thin layers (thin Si layer and thin buried silicon oxide layer) are determined by the implantation process, this method makes it difficult to achieve thicknesses of less than 50 nm for the thin silicon layer and 80 nm for the buried $SiO_2$ layer.

A second method, known by the name of "BESOI technique", consists of forming a thin $SiO_2$ film on a surface of a first silicon body, then bonding this first body to a second silicon body by means of the thin $SiO_2$ film, and finally, removing part of one of the silicon bodies by mechanical grinding and polishing in order to form the thin silicon layer above the buried silicon oxide layer.

The silicon oxide layer on the first silicon body is formed by successively oxidizing the surface of this first body, then etching the oxide layer formed in order to obtain the desired thickness.

This method only allows relatively thick buried silicon oxide layers and silicon layers to be produced on the buried silicon oxide because of the poor control of the etching method. Furthermore, the thin layers obtained by this method have poor uniformity.

A third method, known by the name of "SMART CUT technology", consists of forming, by oxidation, a thin silicon oxide layer on a first silicon body, then implanting $H^+$ ions in the first silicon body in order to form a cavity plane in this first silicon body under the thin silicon oxide layer. Subsequently, by means of the thin silicon oxide layer, this first body is bonded to a second silicon body and then the assembly subjected to thermal activation in order to transform the cavity plane into a cleaving plane. This makes it possible to recover, on the one hand, an SOI substrate and, on the other hand, a reuseable silicon body.

This method requires the implantation of a high dose of hydrogen atoms. In spite of using atoms of smaller size for the implantation, the surface of the thin silicon layer obtained is also damaged. Furthermore, since the thickness of the thin silicon layer is defined by the implantation energy of the hydrogen atoms, it is difficult to make this thickness less than about 50 nm.

The methods above are described, in particular, in the article SOI: *Materials to Systems*, A. J. Auberton-Hervé, 1996, IEEE.

Therefore, a method of fabricating an SOI substrate, which overcomes the drawbacks of the methods of the prior art, may be desired.

In particular, a method of fabricating an SOI substrate which makes it possible to produce silicon oxide layers and silicon layers on the buried oxide layer that are very thin and of very good uniformity may be favorable.

A method of fabricating an SOI substrate that can be implemented in standard equipment may also be desired.

SUMMARY OF THE INVENTION

According to a first embodiment of the invention, the method of fabricating a silicon substrate having a thin buried silicon oxide layer includes:

a) the production of a first element having a silicon body, a main surface of which is coated with a buffer layer made of germanium or of a germanium-silicon alloy and with a thin silicon layer, in that order;

b) the production of a second element, distinct from the first element, having a silicon body, a main surface of which is coated with a thin silicon oxide layer;

c) the bonding of the first element to the second element such that the thin silicon layer of the first element is in contact with the thin silicon oxide layer of the second element; and d) the removal of the buffer layer made of germanium or of a germanium-silicon alloy in order to recover the silicon substrate having a thin buried silicon oxide layer, on the one hand, and a reuseable silicon substrate, on the other hand.

According to a second embodiment of the invention, the method of fabricating a silicon substrate having a thin buried silicon oxide layer includes:

a) the production of a first element having a silicon body with a main surface and coated with a buffer layer made of germanium or of a germanium-silicon alloy, a thin silicon layer and a thin silicon oxide layer, in that order;

b) the production of a second element having a silicon body, a main surface of which is coated with a thin silicon oxide layer;

c) the bonding of the first element to the second element, such that the thin silicon oxide layer of the first element is in contact with the thin silicon oxide layer of the second element; and d) the removal of the buffer layer in order to recover the silicon substrate having a thin buried silicon oxide layer, on the one hand, and a reuseable silicon substrate, on the other hand.

In a third embodiment of the invention, the method of fabricating a silicon substrate having a thin buried silicon oxide layer includes:

a) the production of a first element having a silicon body, a main surface of which is coated with a buffer layer made of germanium or of a germanium-silicon alloy, a thin silicon layer and a thin silicon oxide layer, in that order;

b) the production of a second element comprising a silicon body;

c) the bonding of the first element to the second element such that the thin silicon oxide layer of the first element is in contact with the silicon body of the second element; and d) the removal of the buffer layer in order to recover the silicon substrate having a thin buried silicon oxide layer, on the one hand, and a reuseable silicon substrate, on the other hand.

The thin buffer layers made of Ge and germanium-silicon alloys of the first element may be produced by epitaxial deposition. For example, the thin buffer layers are produced by well-known methods of vapor deposition or of molecular beam epitaxial deposition, such that the thin silicon layer may have a very small thickness of a few nanometers while still having a suitable uniformity, typically from 1 to 50 nm.

The thin buried oxide layer may be produced by a known thermal oxidation method, such that it is possible to obtain an oxide layer of very high quality with a virtually arbitrary thickness that can vary from 2 nm to 400 nm.

As is known per se, the bonding of the first and of the second elements can be carried out by using the Van der Waals forces. In order to increase the strength at the interface between the elements, the assembly can possibly be subjected to annealing.

The buffer layer of the first element may consist of pure germanium, of a silicon-germanium alloy or of a silicon-germanium alloy containing carbon. More particularly, $Si_{1-x}Ge_x$ alloys ($0<x<1$) or $Si_{1-x-y}Ge_xC_y$ alloys ($0<x\leq0.95$ and $0<y\leq0.05$) can be used.

As is known, the germanium and the $Si_{1-x}Ge_x$ and $Si_{1-x-y}Ge_xC_y$ alloys have very high selectivity to chemical etching by solutions or to anisotropic plasma etching. In the case of silicon-germanium alloys, in order to obtain etching of high selectivity, it is preferable that the proportion of germanium in the alloy is at least equal to 10% by weight, and preferably equal to or greater than 30% by weight.

The use of the silicon-germanium alloy containing a small proportion of carbon makes it possible to reduce the high stresses between the silicon layers and the buffer layer. Thus, it is possible to use alloys with higher germanium concentrations and, consequently, with better etching selectivity, while producing a relaxation of the stresses. It is also possible to form a buffer layer made of a silicon-germanium alloy having a germanium concentration gradient (relaxed SiGe buffer layer). In this type of buffer layer, the germanium concentration increases from the silicon body of the first element.

It is thus possible to make relatively thick buffer layers, which can significantly increase the etching rate. Because of their thickness, the buffer layers may have a surface free of dislocations (all the dislocations and defects being located in the low part of the buffer layer), which provides good conditions and good continuity for the epitaxial growth of the thin single-crystal silicon layer which is to be deposited later.

In the SiGe alloy layer, the concentration profile of the germanium can be nonuniform. Thus, at the bottom of the layer, the Ge concentration can be 0%, then increase to 50% (or 70% and even 100%), and then decrease down to 0%. This solution makes it possible to avoid deformations in the upper silicon layer and to remove the thickness limitations. A high molar fraction of Ge in the SiGe alloy (in particular in the middle of the layer) provides, on the one hand, a very high selectivity of the etching method and, on the other hand, freedom from the risk of relaxation of the Si film.

BRIEF DESCRIPTION OF THE DRAWINGS

The remainder of the description refers to the appended figures, which show.

DESCRIPTION OF THE PREFERRED EMBODIMENTS

Figure 1A:
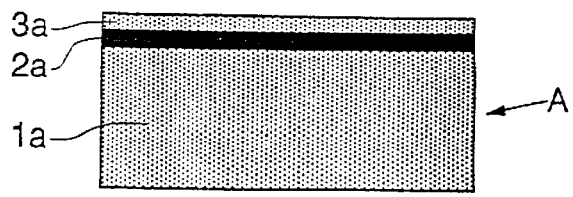
FIGS. 1a to 1e depict the main steps of a first embodiment of the method of the invention.

With reference to FIGS. 1a to 1e, a first embodiment of the method of the invention starts, as shown in FIG. 1a, with the successive deposition by epitaxy (for example, by chemical vapor deposition or by molecular beam epitaxy) of a layer 2a of germanium, or a silicon-germanium alloy possibly including a small proportion of carbon, then of a thin silicon layer 3a.

Typically, the buffer layer 2a and the silicon layer 3a have a thickness of from 1 to 50 nm. Thus a first element A is made, having a silicon body 1a with a main surface coated with a buffer layer 2a made of germanium, or of a germanium-silicon alloy, and with a thin silicon layer 3a, in that order.

Figure 1B:
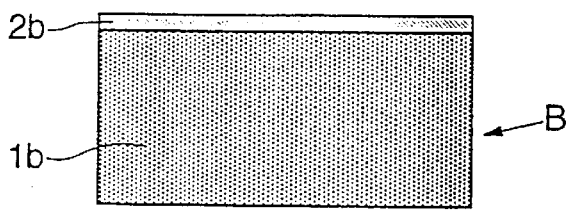

Moreover, a thin silicon oxide layer 2b is formed on a silicon body 1b, distinct from the previous silicon body, by a conventional thermal oxidation method. This produces a second element B having a silicon body 1b, a main surface of which is coated with a thin silicon oxide layer 2b, as shown in FIG. 1b.

Figure 1C:
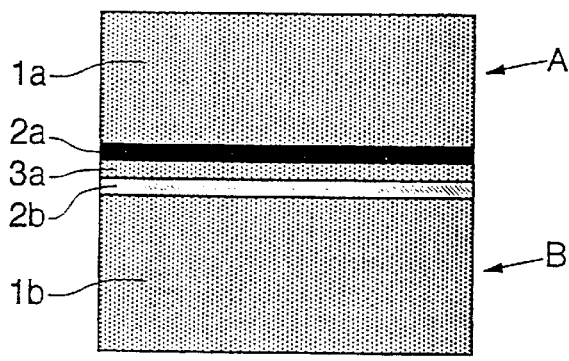

At this stage, the first element A and the second element B are bonded, as is shown in FIG. 1c, such that the thin silicon layer 3a of the first element A is in contact with the silicon oxide layer 2b of the second element B. The first and second elements A and B are bonded one to the other, in a known manner, using the Van der Waals forces.

Figure 1D:
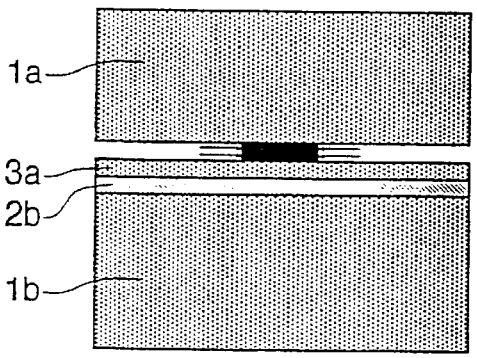

The selective removal of the buffer layer 2a is then carried out, as shown in FIG. 1d. For example, a well-known oxidizing chemistry may be used, such as a solution comprising 40 ml of 70% $HNO_3$+20 ml of $H_2O_2$+5 ml of 0.5% HF or by anisotropic plasma etching.

Figure 1E:
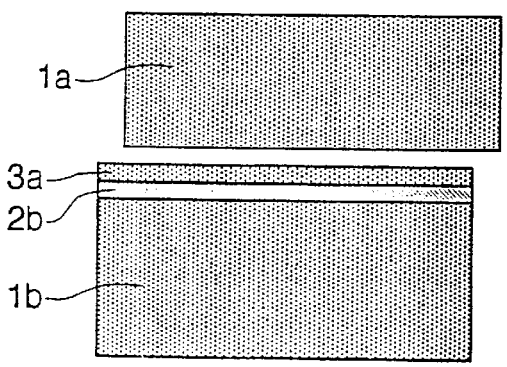

Once the buffer layer 2a is completely removed, a silicon substrate is obtained, as shown in FIG. 1e. The silicon substrate includes a buried silicon oxide layer 2b.

The SOI substrate obtained does not require additional polishing as is the case in the techniques of the prior art, in particular the techniques known as "BESOI" and "SMART CUT".

Finally, the silicon body 1a is not lost and can be recycled to be used. For example, the silicon body 1a may be used as a silicon body for the fabrication of the elements A or B.

FIGS. 2a to 2e show the main steps of a variant of the method described above. The method of this variant differs from the method described in relation to FIGS. 1a to 1e in that a thin silicon oxide layer 4a has been made to grow on the thin silicon layer 3a of the first element A above. The thin silicon oxide layer 4a may be grown by thermal oxidation. This may produce a first element A comprising a silicon substrate 1a, a main surface of which is coated with a buffer layer 2a made of germanium, or of a silicon-germanium alloy, a thin silicon layer 3a, and finally, with a thin silicon oxide layer 4a, in that order.

Figure 2A:
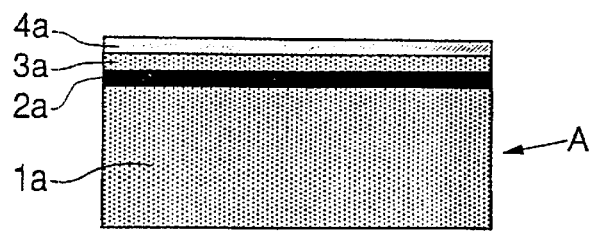
FIGS. 2a to 2e depict the main steps of a second embodiment of the method of the invention.
Figure 2B:
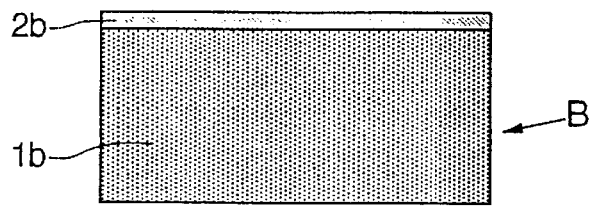

The second element B, shown in FIG. 2b, is identical to that of the previous method.

Figure 2C:
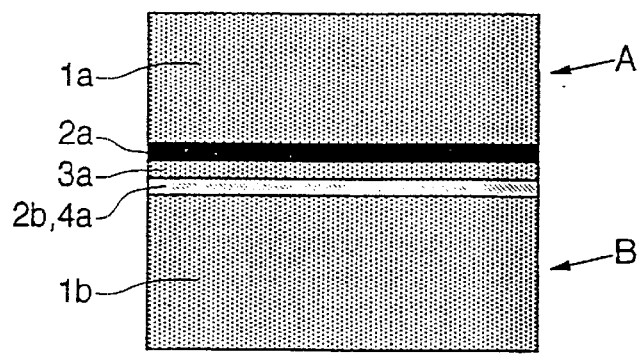

The first element A and the second element B are then bonded as above, such that the silicon oxide layer 4a of the first element A is in contact with the silicon layer 2b of the second element B, as shown in FIG. 2c.

Although, in this case, the first element A and the second element B can be bonded by means of Van der Waals forces, it is preferable to subject the assembly to a thermal treatment so that the elements have a good mechanical bond. For example, the assembly can be heated to a temperature of 1000° C. for a duration of about 30 minutes (as in the BESOI technology).

Figure 2D:
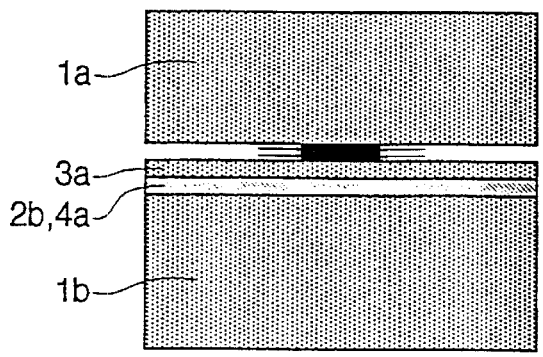
Figure 2E:
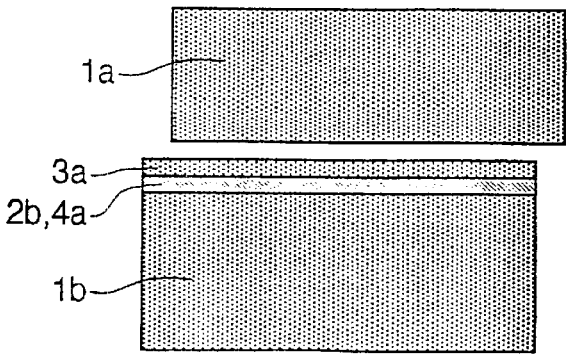

The method is finished as above and as shown in FIGS. 2d and 2e, by removing the buffer layer, so as to obtain an SOI substrate having a buried silicon layer produced by the bonding of the silicon oxide layers 3a and 2b of the first and second elements, and a reuseable silicon substrate 1a.

By proceeding in this way, it is possible to further improve the quality of the interface between the buried silicon oxide layer 4a, 2b, and the thin silicon layer 3a thereabove.

In another variant of the method of the invention, it is possible to proceed in the same way as described in connection with FIGS. 2a to 2e, but by using a second element B consisting solely of a silicon substrate.

What is claimed is:

1. A method of fabricating a silicon substrate comprising a thin buried silicon oxide layer, the method comprising:

producing a first element comprising a first silicon body, wherein a main surface of the first element is coated with a buffer layer comprising germanium and a thin silicon layer, in that order;

producing a second element comprising a second silicon body, wherein a main surface of the second element is coated with a thin silicon oxide layer;

bonding the first element to the second element such that the thin silicon layer of the first element is in contact with the thin silicon oxide layer of the second element; and removing the buffer layer in order to recover the silicon substrate comprising the thin buried silicon oxide layer and a reusable silicon substrate.

2. The method of claim 1, wherein the buffer layer comprises a silicon-germanium alloy chosen from the alloys $Si_{1-x}Ge_x(0<x<1)$ and $Si_{1-x-y}Ge_xC_y(0<x<0.95; 0<y\leq0.05)$.

3. The method of claim 1, wherein the buffer layer comprises a germanium-silicon alloy, and wherein the germanium-silicon alloy comprises at least 10% by weight of germanium.

4. The method of claim 1, wherein the buffer layer comprises a layer made of a silicon-germanium alloy having a germanium concentration gradient.

5. The method of claim 1, further comprising forming the buffer layer and the thin silicon layer of the first element by epitaxial deposition.

6. The method of claim 5, wherein the epitaxial deposition comprises chemical vapor deposition or molecular beam epitaxial deposition.

7. The method of claim 1, further comprising forming the silicon oxide layers by thermal oxidation.

8. The method of claim 1, wherein removing the buffer layer comprises selective dissolution of the buffer layer by an oxidizing solution or by anisotropic plasma etching.

9. The method of claim 1, wherein the buffer layer comprises a germanium-silicon alloy.

10. The method of claim 1, wherein the buffer layer comprises a germanium-silicon alloy, and wherein the germanium-silicon alloy comprises at least 30% by weight of germanium.

11. A method of fabricating a silicon substrate comprising a thin buried silicon oxide layer, the method comprising:

producing a first element comprising a first silicon body, wherein a main surface of the first element is coated with a buffer layer comprising germanium, a thin silicon layer, and a first thin silicon oxide layer, in that order;

producing a second element comprising a second silicon body, wherein a main surface of the second element is coated with a second thin silicon oxide layer;

bonding the first element to the second element such that the first thin silicon oxide layer of the first element is in contact with the second thin silicon oxide layer of the second element; and removing the buffer layer in order to recover the silicon substrate comprising the thin buried silicon oxide layer and a reusable silicon substrate.

12. The method of claim 11, wherein the buffer layer comprises a silicon-germanium alloy chosen from the alloys $Si_{1-x}Ge_x(0<x<1)$ and $Si_{1-x-y}Ge_xC_y(0<x<0.95; 0<y\leq0.05)$.

13. The method of claim 11, wherein the buffer layer comprises a germanium-silicon alloy, and wherein the germanium-silicon alloy comprises at least 10% by weight of germanium.

14. The method of claim 11, wherein the buffer layer comprises a layer made of a silicon-germanium alloy having a germanium concentration gradient.

15. The method of claim 11, further comprising forming the buffer layer and the thin silicon layer of the first element by epitaxial deposition.

16. The method of claim 15, wherein the epitaxial deposition comprises chemical vapor deposition or molecular beam epitaxial deposition.

17. The method of claim 11, further comprising forming the silicon oxide layers by thermal oxidation.

18. The method of claim 11, wherein removing the buffer layer comprises selective dissolution of the buffer layer by an oxidizing solution or by anisotropic plasma etching.

19. The method of claim 11, wherein the buffer layer comprises a germanium-silicon alloy.

20. The method of claim 11, wherein the buffer layer comprises a germanium-silicon alloy, and wherein the germanium-silicon alloy comprises at least 30% by weight of germanium.

21. A method of fabricating a silicon substrate comprising a thin buried silicon oxide layer, the method comprising:

producing a first element comprising a silicon body, wherein a main surface of the first element is coated with a buffer layer comprising germanium, a thin silicon layer, and a thin silicon oxide layer, in that order;

obtaining a second element comprising a silicon body;

bonding the first element to the second element such that the thin silicon oxide layer of the first element is in contact with the silicon body of the second element; and removing the buffer layer in order to recover the silicon substrate comprising the thin buried silicon oxide layer and a reusable silicon substrate.

22. The method of claim 21, wherein the buffer layer comprises a silicon-germanium alloy chosen from the alloys $Si_{1-x}Ge_x(0<x<1)$ and $Si_{1-x-y}Ge_xC_y(0<x<0.95; 0<y\leq0.05)$.

23. The method of claim 21, wherein the buffer layer comprises a germanium-silicon alloy, and wherein the germanium-silicon alloy comprises at least 10% by weight of germanium.

24. The method of claim 21, wherein the buffer layer comprises a layer made of a silicon-germanium alloy having a germanium concentration gradient.

25. The method of claim 21, further comprising forming the buffer layer and the thin silicon layer of the first element by epitaxial deposition.

26. The method of claim 25, wherein the epitaxial deposition comprises chemical vapor deposition or molecular beam epitaxial deposition.

27. The method of claim 21, further comprising forming the silicon oxide layers by thermal oxidation.

28. The method of claim 21, wherein removing the buffer layer comprises selective dissolution of the buffer layer by an oxidizing solution or by anisotropic plasma etching.

29. The method of claim 21, wherein the buffer layer comprises a germanium-silicon alloy.

30. The method of claim 21, wherein the buffer layer comprises a germanium-silicon alloy, and wherein the germanium-silicon alloy comprises at least 30% by weight of germanium.

* * * * *